(12) United States Patent
Nakao

(10) Patent No.: US 7,397,278 B2
(45) Date of Patent: Jul. 8, 2008

(54) LEVEL SHIFTING CIRCUIT AND DISPLAY ELEMENT DRIVING CIRCUIT USING SAME

(75) Inventor: Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/341,611

(22) Filed: Jan. 30, 2006

(65) Prior Publication Data

US 2006/0214686 A1 Sep. 28, 2006

(30) Foreign Application Priority Data

Jan. 31, 2005 (JP) ............................... 2005-023863

(51) Int. Cl.
*H03K 19/096* (2006.01)
(52) U.S. Cl. .......................................... 326/68; 326/83
(58) Field of Classification Search .................... 326/63, 326/68–74, 80–86; 345/204
See application file for complete search history.

(56) References Cited

U.S. PATENT DOCUMENTS

| | | | | |
|---|---|---|---|---|
| 3,976,984 | A * | 8/1976 | Hirasawa | ..................... 365/182 |
| 5,132,563 | A * | 7/1992 | Fujii et al. | ..................... 326/27 |
| 6,522,323 | B1 | 2/2003 | Sasaki et al. | |
| 6,636,071 | B1 * | 10/2003 | Yatabe | ......................... 326/80 |
| 7,071,758 | B2 * | 7/2006 | Tseng et al. | ................. 327/333 |
| 2003/0076149 | A1 | 4/2003 | Orfitelli et al. | |
| 2005/0195011 | A1 | 9/2005 | Tseng et al. | |
| 2007/0075760 | A1 | 4/2007 | Tseng et al. | |

FOREIGN PATENT DOCUMENTS

| | | | |
|---|---|---|---|
| JP | 63-116519 | A | 5/1988 |
| JP | 04-284021 | | 10/1992 |
| JP | 9-006295 | A | 1/1997 |
| JP | 11-355127 | A | 12/1999 |
| JP | 2000-349617 | A | 12/2000 |
| JP | 2001-057518 | A | 2/2001 |
| JP | 2001-85990 | A | 3/2001 |
| JP | 2003-108089 | A | 4/2003 |
| JP | 2003-115758 | | 4/2003 |

* cited by examiner

*Primary Examiner*—Don Le
(74) *Attorney, Agent, or Firm*—Harness, Dickey & Pierce, P.L.C.

(57) ABSTRACT

A P-channel MOS transistor and an N-channel MOS transistor are respectively controlled by a first control signal and a second control signal. The first control signal CTL1 and the second control signal CTL2 are independent from each other. The second control signal CTL2 is generated by a NOR circuit 2 to which a data signal DATA and a third control signal CTL3 are inputted. A load capacitor C1 which samples the first electric potential or the GND electric potential is configured by a gate capacitance of another MOS transistor.

12 Claims, 8 Drawing Sheets

(CONVENTIONAL EXAMPLE 1)

(CONVENTIONAL EXAMPLE 2)

US 7,397,278 B2

LEVEL SHIFTING CIRCUIT AND DISPLAY ELEMENT DRIVING CIRCUIT USING SAME

This Nonprovisional application claims priority under 35 U.S.C. § 119(a) on Patent Application No. 2005/023863 filed in Japan on Jan. 31, 2005, the entire contents of which are hereby incorporated by reference.

FIELD OF THE INVENTION

The present invention relates to a level shifting circuit, and in particular, the present invention relates to a level shifting circuit having a sampling circuit of a C-MOS configuration, which is needed in a TFT-LCD source driver circuit, for transmitting a digital signal between circuits respectively having different power source voltages.

BACKGROUND OF THE INVENTION

In a TFT-LCD source driver circuit in general, a liquid crystal panel is driven as follows. Namely, a display-use signal is digitally processed by a logic circuit which is operated by a power source voltage of approximately 3V. Then, the signal is converted into a voltage of approximately 10V which is required for driving a liquid crystal panel of the TFT-LCD.

FIG. 8 illustrates an exemplary configuration of a TFT-LCD module. In the TFT-LCD module, a control circuit 102 controls a plurality of gate driver circuits 103 . . . and a plurality of source driver circuits 104 . . . , so that the gate driver circuits 103 . . . and the source driver circuits 104 . . . drive a liquid crystal panel 101.

FIG. 9 illustrates a configuration of each of the source driver circuits 104. Each source driver circuit 104 includes, sequentially from a side of the control circuit 102 towards a side of the liquid crystal panel 101: shift registers 104a . . . ; sampling latch circuits 104b . . . ; hold latch circuits 104c . . . ; level shifting circuits 104d . . . ; DA converter circuits 104e . . . ; and output amplifiers 104f. . . .

Further, FIG. 10 illustrates an exemplary configuration of the TFT-LCD source driver circuit 104 for each output terminal. In the following explanation with reference to FIG. 10, it is assumed that display data is in 6 bits. For each bit of the 6 bit display data, one of the sampling latch circuits 104b . . . , one of the hold latch circuits 104c . . . , and one of the level shifting circuit 104d are provided.

Each bit of the display data is sampled in the sampling latch circuit 104b based on a start pulse signal transmitted through the shift register 104a (not shown). Then, in the hold latch circuit 104c, each of the 6 bits are latched based on a latch signal (horizontal sync. signal) (not shown). After a signal level of the display data is converted in the level shifting circuit 104d, a voltage for tone display is selected in accordance with the display data (6 bits in this case), in the DA converter circuit 104e. Then, a low-impedance process is carried out in the output amplifier 104f (voltage follower circuit in FIG. 10), and the display data is outputted to the liquid crystal panel 101.

In FIG. 10, the shift register 104a, the sampling latch circuit 104b, and the hold latch circuit 104c are conventionally a logic circuit which is operated by the power source voltage of approximately 3V. Further, the DA converter circuit 104e and the output amplifier 104f are analogue circuit which is operated by the power source voltage of approximately 10V. Accordingly, it is necessary to provide, between the logic circuit and the analogue circuit, the level shifting circuit 104d which converts a logic signal of 3V into a logic signal of 10V.

Next, the following describes, with reference to FIG. 4, a first conventional example of a level shifting circuit (See, for example, Japanese Unexamined Patent Application No. 4-284021/1992 (Tokukaihei 4-284021; published on Oct. 8, 1992)). A level shifting circuit 111 of FIG. 4 includes: P-channel MOS transistors MP 111, MP 112, MP113, and MP 114; N-channel MOS transistors MN 111 and MN 112; and an inverter 112. The source of the MOS transistor MP 111 is connected to a 10V-power supply, and the drain of the MOS transistor MP 111 is connected to the source of the MOS transistor MP113. The gate of the MOS transistor MP 111 is connected to a connection point-b of the MOS transistor MP 114 and the MOS transistor MN 112.

The drain of the MOS transistor MP113 is connected to the drain of the MOS transistor MN 111, and the source of the MOS transistor MN 111 is connected to a GND. The gates of the MOS transistors MP113 and MN 111 are connected to an input terminal IN of the level shifting circuit 111.

The source of the MOS transistor MP 112 is connected to the 10V-power supply, and the drain of the MOS transistor MP 112 is connected to the source of the MOS transistor MP 114. The gate of the MOS transistor MP 112 is connected to a connection point-a of the MOS transistor 113 and the MOS transistor MN 111.

The drain of the MOS transistor MP114 is connected to the drain of the MOS transistor MN 112, and the source of the MOS transistor MN 112 is connected to the GND. The gates of the MOS transistors MP114 and MN 112 are connected, via the inverter 112, to an input terminal IN of the level shifting circuit 111.

Further, the gate of the MOS transistor MP 112, and the connection point of the MOS transistor MP 113 and MN 111 serve as an output terminal OUT of the level shifting circuit 111.

In the level shifting circuit 111, for example, when a voltage of a small amplitude (e.g., 3V to 5V) is inputted to the input terminal IN, a voltage of 10V in amplitude is outputted from the output terminal OUT. When a low-level voltage is inputted to the input terminal IN, the MOS transistors MP 111, MP113, MN 112 are switched to the ON state, while the MOS transistors MP 112, MP 114, and MN 111 are switched to the OFF state, thus outputting the voltage of 10V from the output terminal OUT.

Here, FIG. 5 illustrates an example where the circuit configuration of FIG. 4 is applied to a TFT-LCD source driver circuit. A TFT-LCD source driver circuit 121 includes: a sampling latch circuit 122; a hold latch circuit 123; a level shifting circuit 111; and an output buffer circuit 125.

The sampling latch circuit 122 includes: a tri-state inverters 122a and 122b; and an inverter 122c. In the tri-state inverter 122a, a sampling signal SMP is used as a clock signal, and an inverted signal of the sampling signal SMP is used as an inverted clock signal. Further, in the tri-state inverter 122b, the sampling signal SMP is used as the inverted clock signal, and the inverted signal of the sampling signal SMP is used as a clock signal. An output from the tri-state buffer 122a is inputted to the inverter 122c, and an output from the inverter 122c is inputted to the hold latch circuit 123. Further, the output from the inverter 122c is also inputted to the tri-state inverter 122b, and an output from the tri-state inverter 122b is inputted to the inverter 122c.

The hold latch circuit 123 includes: tri-state inverters 123a and 123b; and an inverter 123c. In the tri-state inverter 123a, a strobe signal SRT is used as a clock signal, and an inverted signal of the strobe signal SRT is used as an inverted clock signal. Further, in the tri-state inverter 123b, the strobe signal SRT is used as an inverted clock signal, and the inverted signal of the strobe signal SRT is used as the clock signal. An output from the tri-state buffer 123a is inputted to the inverter 123c, and an output from the inverter 123c is inputted to the level shifting circuit 111, via the inverter 124. Further, the output from the inverter 123c is also inputted to the tri-state inverter 123b, and an output from the tri-state inverter 123b is inputted to the inverter 123c.

The level shifting circuit 111 performs the operation which has already been mentioned above, and the output therefrom is inputted to the output buffer circuit 125. The output buffer circuit 125 is a stage in which an inverter 126 and an inverter 127 are cascade-connected with each other. The inverter 126 is a CMOS inverter including a P-channel MOS transistor MP 126 and an N-channel MOS transistor MN 126. An output from the level shifting circuit is inputted to the gates of the MOS transistors MP 126 and MN 126. The output from the inverter 126 is outputted as an output signal/OUT ("/" represents a bar), and is inputted to the inverter 127. The inverter 127 is a CMOS inverter including a P-channel MOS transistor MP 127 and an N-channel MOS transistor MN 127. The output from the inverter 126 is inputted to the gates of the MOS transistors MP 127 and MN127. The output from the inverter 127 is outputted, as an output signal OUT, to a next circuit.

In the TFT-LCD source driver circuit 121, the sampling latch circuit 122, the hold latch circuit 123, and the inverters 124, and 112 constitute a 3V-logic circuit. Further, members of the level shifting circuit 111 other than the inverter 112, and the output buffer circuit 125 constitute a 10V-medium-voltage resilient circuit.

Next, the following deals with a second conventional example using a precharge-type level shifting circuit which uses a dynamic sampling circuit. FIG. 6 illustrates a dynamic decoding circuit 131 which is commonly used in an address decoder of a memory. This circuit is applicable to a level shifting circuit. The dynamic decoding circuit 131 includes: a P-channel MOS transistor MP 131; an N-channel MOS transistor MN 131; N-channel MOS transistors MN 132(0) to MN 132(n−1); and a load capacitor C131.

The source of the MOS transistor MP 131 is connected to a power supply of a higher electric potential, and the drain of the MOS transistor MP 131 is connected to the drain of the MOS transistor MN 131. The source of the MOS transistor MN 131 is connected to the drain of the MOS transistor MN 132(n−1). The MOS transistors MN 132(0) to MN132(n−1) are sequentially and serially connected from the GND to the source of the MOS transistor MN 131. A precharge signal/PRE is inputted to the gates of the MOS transistors MP 131 and MN131. Further, data sets D(0) to D(n−1) are respectively inputted to the gates of the MOS transistors MN 132(0) to MN132(n−1). The load capacitor C131 is a capacitor connected to the wiring extended from a connection point, of the MOS transistor MP 131 and the MOS transistor MN 131, to an output terminal OUT. It is assumed that a capacitance of this load capacitor C131 includes a parasitic capacitance of the circuit including: a parasitic capacitance of the wiring; and a parasitic capacitance of an element connected to the wiring.

An exemplary technology for applying the dynamic decoding circuit 131 to a level shifting circuit is disclosed in, for example, Japanese Unexamined Patent Publication No. 115758/2003 (Tokukai 2003-115758; Published on Apr. 18, 2003). FIG. 7 is a circuit diagram of the technology. A level shifting circuit 141 illustrated in FIG. 7 includes: P-channel MOS transistors MP141 and MP142; N-channel MOS transistors MN141 to MN144; and load capacitors C141 and C142.

The source of the MOS transistor MP 141 is connected to a 10V-power supply, and the drain of the MOS transistor MP 141 is connected to the drain of the MOS transistor MN 143. The source of the MOS transistor MN143 is connected to the drain of the MOS transistor 142, and the source of the MOS transistor 142 is connected to a GND. The MOS transistor MN 141 is connected between an input terminal IN and the gate of the MOS transistor MN 142. The load capacitor C141 is connected to wiring between the gate of the MOS transistor MN 142 and the MOS transistor MN 141. The load capacitor C141 includes a parasitic capacitance of the wiring.

The source of the MOS transistor MP 142 is connected to the 10V-power supply, and the drain of the MOS transistor MP 142 is connected to the drain of the MOS transistor MN 144. The source of the MOS transistor MN 144 is connected to the GND. The gates of the MOS transistor MP142 and MN144 are connected to a connection point of the MOS transistor MP 141 and the MOS transistor MN 143, and the load capacitor C142 is a capacitor connected to wiring connecting the gates and the connection point. This load capacitor C142 includes a parasitic capacitance of the circuit including: a parasitic capacitance of the wiring; and a parasitic capacitance of an element connected to the wiring.

The connection point of the MOS transistor MP 142 and the MOS transistor MN 144 serves as an output terminal OUT. For example, a voltage of 3V in amplitude is inputted to the input terminal IN. A sampling pulse signal SMP is inputted to the gates of the MOS transistor MP 141 and the MOS transistor MN 143. An inverted signal XSMP of the sampling pulse signal SMP is inputted to the gate of the MOS transistor MN 141.

Next described is a basic operation of the level shifting circuit 141 illustrated in FIG. 7. For example, when the sampling pulse signal SMP is a low level, and the inverted signal XSMP is at a high level (10V) as such, the precharge-use MOS transistor MP 141 is switched to the ON state, and the MOS transistor MN 141 is also switched to the ON state. Meanwhile, the MOS transistor MN 143 is switched to the OFF state. Accordingly, the load capacitor C142 is charged by the 10V power supply, via the MOS transistor MP 141, so that the load capacitor C142 is precharged to the power supply voltage of 10V. Further, since the MOS transistor MN 141 is in the ON state, an electric potential of an input signal IN (0V to 3V) is applied to the load capacitor C141, as a terminal voltage, thus charging the load capacitor C141.

Next, when the sampling pulse signal SMP is the high level (the inverted signal XSMP is the low level), the MOS transistor MN 141 is switched to the OFF state, and the load capacitor C141 is electrically disconnected from the input terminal IN. Further, the evaluation-use MOS transistor MN 143 is switched to the ON state, and the precharge-use MOS transistor MP 141 is switched to the OFF state. Further, the load capacitor C142 is connected to the GND via the MOS transistors MN 143 and MN142.

At this point, the load capacitor C142 retains the precharged terminal voltage of 10V, or discharges the precharged terminal voltage of 10V down to 0V, in accordance with the electric potential (0V or 3V) of the input signal retained in the load capacitor C141. That is, while the terminal voltage of the load capacitor C141 is 3V, the MOS transistor MN 142, whose gate accepts the terminal voltage of the load capacitor C141, is switched to the ON state. Then, the load capacitor C142 discharges the electric potential stored therein, and the terminal voltage of the load capacitor C142 drops down to the GND potential. Accordingly, the MOS transistor MP 142 which accepts the gate electric potential of 0V is switched to the ON state, and the MOS transistor MN 144 is switched to the OFF state. As a result, the output from the output terminal OUT is the high level (10V). In the process in which the load capacitor C142 discharges the electric potential stored therein, the MOS transistor MP 142 is switched to the ON state when the terminal voltage drops from 10V by a threshold voltage of the MOS transistor MP 142, and the signal voltage of the output terminal OUT starts to rise.

On the contrary, when the terminal voltage of the load capacitor C141 is 0V, the MOS transistor MN 142 is switched to the OFF state, and the electric potential stored in the load capacitor C142 is retained at its terminal voltage of 10V. Further, the MOS transistor MP 142 which accepts the gate electric potential of 10V is switched to the OFF state, and the MOS transistor MN 144 is switched to the ON state. As a result, the signal voltage of the output terminal OUT is 0V. As described, a signal of 10V or 0V can be obtained from the output terminal OUT, in accordance with the electric potential of the input signal at the input terminal IN. Further, in the process in which the load capacitor C142 is precharged with the electric charge to be stored, the MOS transistor MN 144 switched to the ON state, and the signal voltage of the output terminal OUT falls, when the terminal voltage surpasses the threshold voltage of the MOS transistor MN 144.

In the level shifting circuit 111 of the first conventional example, the ON/OFF state of the MOS transistors switches when the voltage level inputted to the input terminal IN transits from the low level to the high level. In view of that, the MOS transistor MP113 whose channel serves as a resistor is provided, so as to: restrain an increase in the electric potential of the connection point a of the MOS transistor MP113 and the MOS transistor MN 111; prevent the MOS transistor MP 112 which needs to be in the ON state from being switched to the OFF state; and avoid a delay in switching the ON/OFF state from the OFF state to the ON state. Similarly, the MOS transistor MP 114 is also provided so that its channel serves as a resistor.

In the first conventional example, the level shifting circuit of FIG. 4 is used. However, in order to ensure a normal electrical properties of the circuit, the MOS transistors MP113 and the MP 114 which serve as the resistor need to be an MOS transistor having a long gate length. Further, in order to achieve a sufficiently low ON-resistance, the MOS transistor MN 111 and the MN 112, whose amplitude of the gate signal is small (voltage level of 3V to 5V), need to be an MOS transistor having a wide gate width. However, all of these MOS transistors are transistors having a large element size, in order to tolerate a high operation voltage. Increasing of the gate length and the gate width of these transistors will cause a significant increase in the planar dimension of the circuit, which consequently enlarges the size of a chip, in a case of forming the circuit into an LSI circuit.

Further, a dynamic sampling circuit is used in the second conventional example of FIG. 7, so as to form so-called a dynamic sampling type level shifting circuit. In this circuit, the sampling pulse signal SMP, during the precharging period, needs to drop down to GND electric potential which switches the MOS transistor MN 143 to the OFF state. On the other hand, the sampling pulse signal SMP, during the data sampling period, needs to rise up to the power supply electric potential which switches the MOS transistor MP 141 to the OFF state. In short, the sampling pulse signal SMP needs to fully swing within the range between the power supply electric potential and the GND potential. Because of so-called gate-feed-through phenomenon, such a transition in electric potential of the sampling pulse signal causes a variation in the electric potential of the output signal through the parasitic capacitance existing between the gate and the drain of the MOS transistor MP 141 and the MN 143. If the load capacitor C142 is reduced, the feed-through-caused variation in the output electric potential becomes large, and the retention of the signal becomes difficult. On this account, there is a limit to the reduction of the size of the load capacitor C142.

Further, in the second conventional example, the logic circuit which combines the data signal (input signal) with the controlling signal (sampling pulse signal) is realized by a circuit in which two MOS transistors (the MOS transistor MN 142 and the MN143) are cascade-connected with each other. For these MOS transistors, it is necessary to adopt transistors having a large element size so that these transistors are tolerable to a high operation voltage. Thus, in the second conventional example, a load capacitor for retaining signal needs to be acquired, and the number of the high-voltage resilient elements increases. For this reason, the planar dimension of the circuit inevitably increases. This is disadvantageous in that the chip size increases in a case of forming the circuit into an LSI.

For example, when either one of these level shifting circuit is adopted to a source driver circuit which serves as a liquid crystal driving circuit (i.e., one of display element driving circuit), the number of the level shifting circuits corresponding to the bit number of the display data are to be arranged for each output. This causes an increase in an planar dimension of an LSI chip.

In conclusion, either of the above described conventional level shifting circuits causes difficulties in reducing the scale of the entire circuit.

SUMMARY OF THE INVENTION

An object of the present invention is to realize a level shifting circuit whose circuit scale is small, and a display element driving circuit using the level shifting circuit.

In order to achieve the object, a level shifting circuit of the present invention is a level shifting circuit including: (A) a first MOS transistor of a P-channel type, whose source is connected to a power supply of a first electric potential which is higher than a GND electric potential; and (B) a second MOS transistor of an N-channel type, whose source is connected to a GND, and whose drain is connected to a drain of the first MOS transistor, the level shifting circuit performing a level shifting process with respect to an input signal, by (a) inputting, to a gate of the second MOS transistor, a gate signal which corresponds to the input signal to be subjected to the level shifting process, and (b) charging a load capacitor up to the first electric potential, or discharging the load capacitor down to the GND level, the load capacitor being connected to a connection point of respective drains of the first and the second MOS transistors, wherein: the first MOS transistor receives the first control signal inputted to the gate thereof as a gate signal, the first control signal being a binary signal which takes, as binary values, (i) the first electric potential and (ii) a second electric potential which is lower than the first electric potential; the first MOS transistor charges the load capacitor up to the first electric potential, when the first MOS transistor receives the first control signal of the second electric potential; the second MOS transistor receives a second control signal inputted to a gate thereof as a gate signal, the second control signal being a binary signal which takes, as binary values, (i) the GND electric potential and (ii) a third electric potential which is higher than the GND electric potential, the second control signal being independent from the first control signal; and the second MOS transistor discharges the load capacitor down to the GND electric potential when the second MOS transistor receives the second control signal of the third electric potential.

With the invention, the first control signal and the second control signal are independent from each other, that is, there is no common control signal to be used for both the first MOS transistor and the second MOS transistor. The level shifting circuit of the present invention has no circuit in which a cross-current is generated by simultaneously switching the MOS transistors to the ON state, the MOS transistors being between the first electric potential power supply and the GND.

Since there is no transition state in which both the first and the second MOS transistors are switched to the ON state at the same time, it is possible to design size of the MOS transistor irrespective of other MOS transistors. Further, there is no longer a need for an element having a long gate-length and/or a wide gate-width, which has been needed in a conventional level shifting circuit. Further, in a case of using an MOS transistor having a large planar dimension for realizing a high-voltage resilience, the level shifting circuit of the present invention only requires two elements (i.e., one P-channel MOS transistor and one N-channel MOS transistor) for performing the level shifting operation and the sampling operation. Thus, it is possible to downsize the planar dimension of the level shifting circuit. Further, when the level shifting circuit is formed into an LSI, the size of the chip can be reduced.

Thus, it is possible to realize a level shifting circuit whose circuit scale is small.

Further, the level shifting circuit of the present invention generates no cross-current, and is advantageous in realizing a circuit whose power consumption is low.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
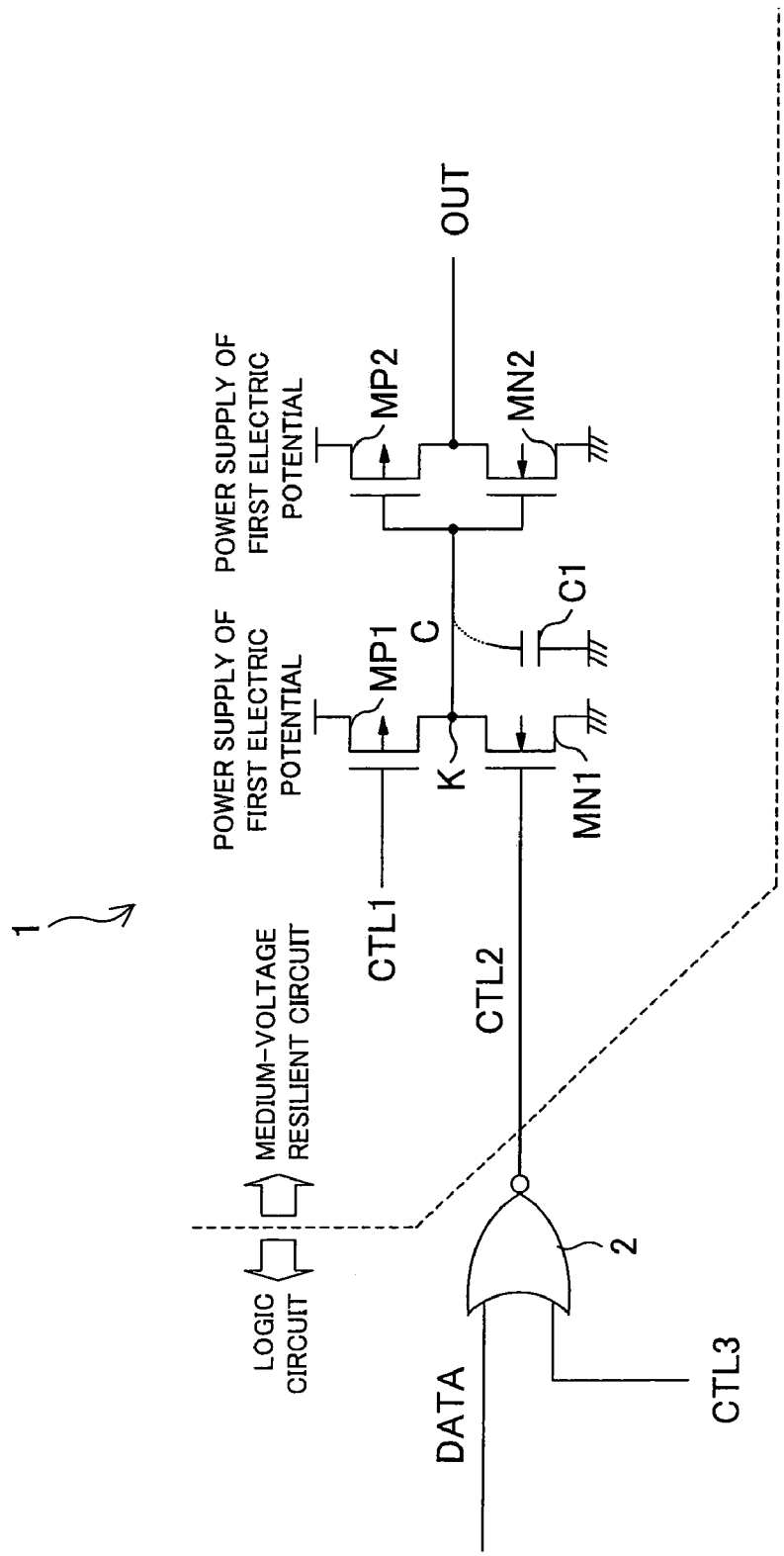
FIG. 1 is an embodiment of the present invention, and is a circuit diagram illustrating a configuration of a level shifting circuit.
Figure 2:
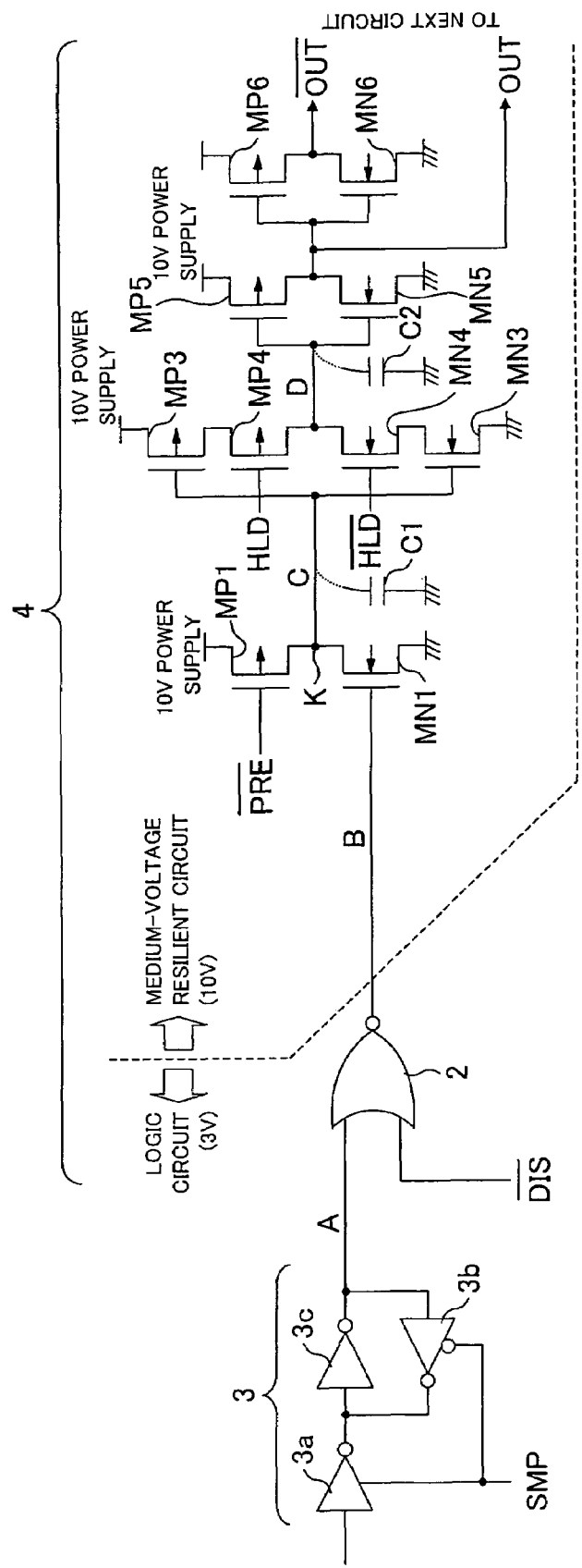
FIG. 2 is a circuit diagram illustrating a part of a configuration of a TFT-LCD source driver circuit to which the level shifting circuit of FIG. 1 is adopted.
Figure 3:
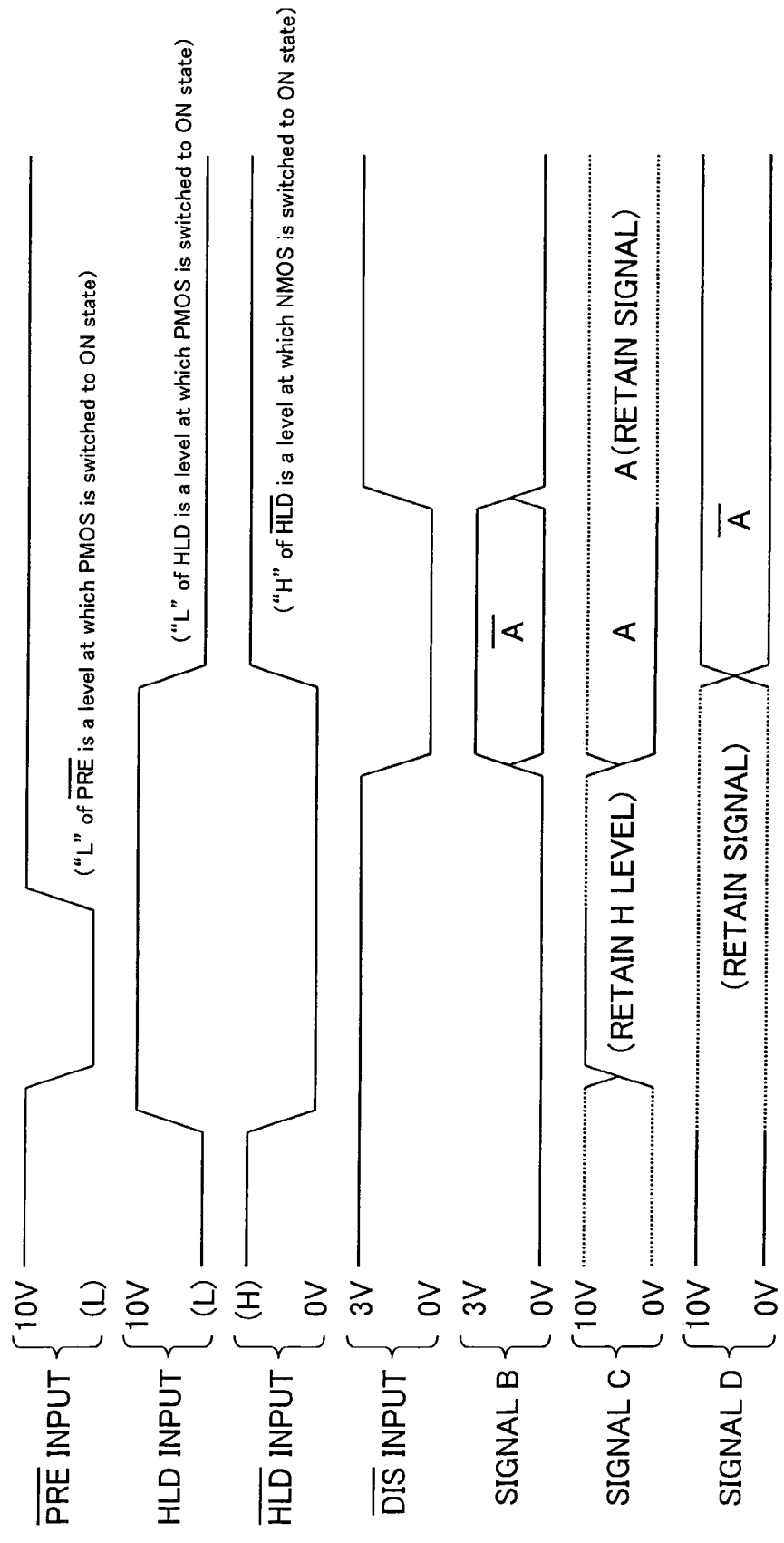
FIG. 3 is a timing chart illustrating signals of the TFT-LCD source driver circuit illustrated in FIG. 2.

The following describes an embodiment of the present invention with reference to FIG. 1 through FIG. 3.

FIG. 1 illustrates a configuration of a dynamic sampling type level shifting circuit 1 (Hereinafter referred to as level shifting circuit), in accordance with the present embodiment.

A level shifting circuit 1 includes: P-channel MOS transistors MP1 and MP2; N-channel MOS transistors MN1 and MN2; and a NOR circuit 2.

The source of the MOS transistor (first MOS transistor) MP1 is connected to a power supply of a first electric potential which is higher than a GND potential. The source of the MOS transistor (second MOS transistor) MN1 is connected to a GND. The drain of the MOS transistor MP1 and the drain of the MOS transistor MN1 are connected with each other, at a connection point-K. A control signal (first control signal) CTL1 is inputted as a gate signal to the gate of the MOS transistor MP1, and a control signal (second control signal) CTL2 is inputted as a gate signal to the MOS transistor MN1.

The source of the MOS transistor MP2 is connected to the power supply of the first electrical potential, and the source of the MOS transistor MN2 is connected to the GND. The drain of the MOS transistor MP2 and the drain of the MOS transistor MN2 are connected with each other, and an output terminal OUT is connected to the connection point of the drains. The gates of the MOS transistors MP2 and MN2 are connected to the connection point-K.

The NOR circuit 2 is a combinational logic circuit having two inputs. To this NOR circuit 2, data signal DATA and a control signal (third control signal) CTL3 are inputted. Then, the NOR circuit 2 outputs an output signal which serves as the control signal CTL2.

Further, a load capacitor C1 is connected to the wiring connecting the connection point-K with the gates of the MOS transistors MP2 and MN2. A capacitance of the load capacitor C1 is a parasitic capacitance of the circuit. This parasitic capacitance includes a parasitic capacitance of the wiring, and/or the gate capacitance of the MOS transistors MP2 and MN2 which are located in the next stage to the MOS transistors MP1 and MN1. Here, it is assumed that the capacitance of the load capacitor C1 is the gate capacitance of the MOS transistors MP2 and MN2. As described, the level shifting circuit 1 includes a sampling circuit of C-MOS configuration, which uses the MOS transistors MP1 and MN1 for sampling the first electric potential and the GND potential, in the load capacitor C1.

In the level shifting circuit 1, the NOR circuit 2 and the stages preceding thereto constitute a logic circuit whose power source voltage is low. And latter stages of the NOR circuit 2 constitute the medium-voltage resilient circuit whose power source voltage is high.

The control signal CTL1 is a binary signal which takes, as binary values, (i) the first electric potential and (ii) the second electric potential which is higher than the GND electric potential but lower than the first electric potential. Further, the control signals CTL2 and CTL3, and the data signal DATA are a binary signal which takes, as binary values, (i) the GND electric potential and (ii) the third electric potential which is higher than the GND electric potential but lower than the first electric potential.

In the level shifting circuit 1 having the above described configuration, when the control signal CTL3 is an "H" level (i.e., third electric potential), the NOR circuit 2 outputs the control signal CTL of an "L" level (i.e., GND potential), irrespective of the value of the data signal DATA. Accordingly, the MOS transistor MN1 is in the OFF state. If the control signal CTL1 at this point is the "L" level (i.e., second electric potential), the MOS transistor MP1 is in the ON state, and the load capacitor C1 is charged up to the "H" level (i.e., first electric potential). When the load capacitor C1 is charged up to the "H" level, the MOS transistor MP2 is switched to the OFF state, the MOS transistor MN2 is switched to the ON state, and the output from the output terminal OUT is the "L" (i.e., GND electrical potential).

Next, when the control signal CTL1 is the "H" (i.e., first electric potential), the MOS transistor MP1 is switched to the OFF state. If the control signal CTL3 at this point is the "L" (i.e., GND potential), the NOR circuit 2 outputs, as the control signal CTL2, an inverted signal of the data signal DATA. While the data signal DATA is the "H" level (i.e., third electric potential), the control signal CTL2 is the "L" level, and therefore the MOS transistor MN1 is switched to the OFF state. Accordingly, the load capacitor C1 retains the electric potential of the "H" level, and an output of the "L" level (i.e., GND potential) is outputted from the output terminal OUT. On the contrary, when the data signal DATA is the "L" level (i.e., GND potential), the control signal CTL2 is the "H" level, and therefore the MOS transistor MN1 is switched to the ON state. Accordingly, the load capacitor C1 discharges its electric potential so that the electric potential becomes the "L" level (i.e. GND potential). Then, the MOS transistor MP2 is switched to the ON state when the MOS transistor MN2 is switched to the OFF state, and an output of the "H" level (i.e. first electric potential) is outputted from the output terminal OUT.

That is, the load capacitor C1 is charged up to the first electric potential the "H", when an electric potential of the "L" level (i.e. second electric potential) is supplied, as the control signal CTL1, to the MOS transistor MP1. On the contrary, the load capacitor C1 discharges down to the GND potential, when an electric potential of the "H" level (i.e. third electric potential) is supplied, as the control signal CTL1, to the MOS transistor MP1.

In the level shifting circuit 1, the load capacitor C1, whose capacitance including the gate capacitance of the MOS transistors MP2 and MN2, samples the first electric potential or the GND electric potential as the electric charge stored. In accordance with the result of the sampling, the level shifting operation is performed.

Next described with reference to FIG. 2 is a configuration of a TFT-LCD source driver circuit (display element driving circuit) to which the level shifting circuit 1 of FIG. 1 is applied. Note that, FIG. 2 only illustrates parts corresponding to a periphery of the level shifting circuit 104d, and the shift register circuit, DA converter circuit, output amplifier, or the like are omitted.

In FIG. 2, the TFT-LCD source driver circuit includes a sampling latch circuit 3 and a level shifting circuit 4.

Figure 10:
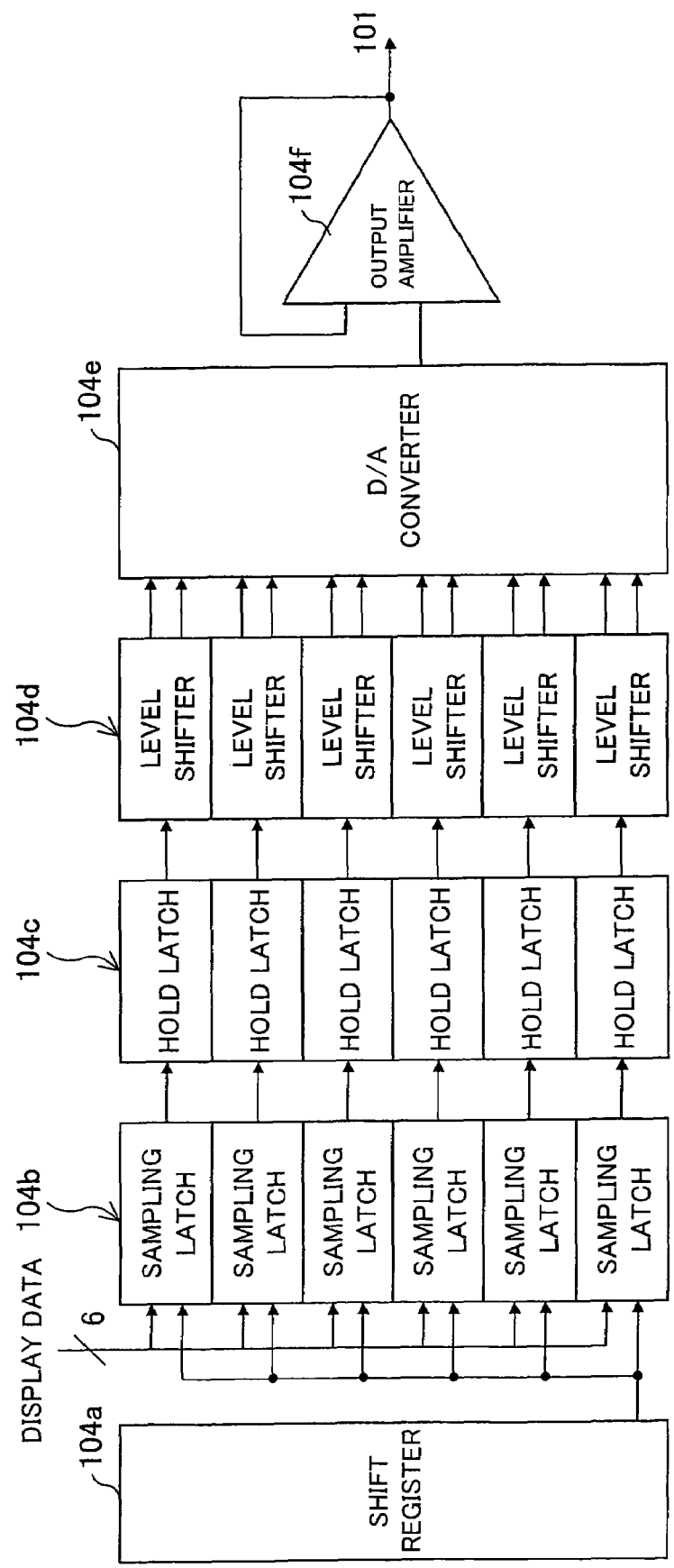
FIG. 10 is a block diagram illustrating a configuration of a block corresponding to each source signal line of the source driver circuit illustrated in FIG. 9.

The sampling latch circuit 3 includes a tri-state inverters 3a and 3b, and an inverter 3c. To the tri-state inverter 3a, display data illustrated in FIG. 10 is inputted, and the output from the tri-state inverter 3a is inputted to the inverter 3c. The output from the inverter 3c is inputted to the level shifting circuit 4 as a signal A, and is inputted to the tri-state inverter 3b. The output from the tri-state inverter 3b is inputted to the inverter 3c.

In the tri-state inverter 3a, a sampling signal SMP is used as a clock signal, and an inverted signal of the sampling signal SMP is used as an inverted clock signal. In the tri-state inverter 3b, a discharge signal/DIS is used as the clock signal, and an inverted signal of the discharge signal/DIS is used as the inverted clock signal.

The level shifting circuit 4 is an alternative form of the level shifting circuit 1, and includes: P-channel MOS transistors MP1, MP3, MP4, MP5, and MP6; N-channel MOS transistors MN1, MN3, MN4, MN5, and MN6; and a NOR circuit 2. The level shifting circuit 4 also includes a sampling circuit for (i) re-sampling, in a load capacitor 2, the output signal obtained after the sampling performed in the load capacitor C1, and (ii) outputting an output signal obtained after the sampling in the load capacitor C2 to a next circuit.

In FIG. 2, the connection between the MOS transistors MP1 and MN1, and the NOR circuit 2 is the same as that of the FIG. 1, except in that: (i) the power supply of FIG. 1 having the first electric potential is a 10V-power supply, (ii) the first control signal is a precharge signal/PRE, (iii) the second control signal is a signal B, (iv) the third control signal is a discharge signal/DIS, and (v) the data signal DATA is a signal A. Further, the capacitance of the load capacitor C1 is the gate capacitance of the later-described MOS transistors MP3 and MN3.

The source of the MOS transistor MP3 is connected to the 10V-power supply, and the drain of the MOS transistor MP3 is connected to the source of the MOS transistor MP4. The drain of the MOS transistor MP4 is connected to the drain of the MOS transistor MN4. The source of the MOS transistor MN4 is connected to the drain of the MOS transistor MN3. The source of the MOS transistor MN3 is connected to the GND. The gates of the MOS transistor MP3 and the MOS transistor MN3 are connected to a connection point-K of the MOS transistor MP1 and the MOS transistor MN1. A hold signal HLD is inputted, as a gate signal, to the gate of the MOS transistor MP4, and the inverted hold signal/HLD is inputted, as a gate signal, to the gate of the MOS transistor MN4. Further, a load capacitor C2 is connected to the wiring connecting (i) a connection point of the MOS transistor MP4 and the MOS transistor MN4 with (ii) the gates of the MOS transistors MP5 and MN5 at the next stage. A capacitance of the load capacitor C2 is a parasitic capacitance as is the case of the load capacitor C1, and includes the gate capacitance of the MOS transistors MP5 and MN5. Further, the signal D is a signal whose voltage is that of the load capacitor C2.

The source of the MOS transistor MP5 is connected to the 10V-power supply, and the drain of the MOS transistor MP 5 is connected to the drain of the MOS transistor MN5. The source of the MOS transistor MN5 is connected to the GND. A connection point of the MOS transistor MP5 and the MOS transistor MN5 is connected to an output terminal OUT, and is connected to the gates of the MOS transistors MP6 and MN6.

The source of the MOS transistor MP6 is connected to the 10V-power supply, and the drain of the MOS transistor MP 6 is connected to the drain of the MOS transistor MN6. The source of the MOS transistor MN6 is connected to the GND. The connection point of the MOS transistor MP6 and the MOS transistor MN6 is connected to an inverted output terminal/OUT.

The output terminal OUT and the inverted output terminal/OUT are connected to a next circuit.

In FIG. 2, a part of the level shifting circuit from the NOR circuit 2 toward the previous stages is a logic circuit, and latter stages of the NOR circuit 2 constitute the medium-voltage resilient circuit.

Next, FIG. 3 is a timing chart of the circuit illustrated in FIG. 2. The following describes in detail about an operation of the level shifting circuit 4, with reference to FIG. 2 and FIG. 3.

In FIG. 2, the precharge signal/PRE is a binary control-signal which: (i) takes, as its "H" level, an electric potential of 10V (where the maximum voltage for driving a liquid crystal panel is 10V) which switches a P-channel MOS transistor to the OFF state, and (ii) takes, as its "L" level, an electric potential which switches the P-channel MOS transistor to the ON state. The electric potential of the "L" level is not particularly limited, provided that the "L" level electric potential is less than the voltage which switches the P-channel MOS transistor to the OFF state. In this case, for example, the "L" level is 7V. Further, the discharge signal/DIS is a binary signal which: (i) takes, as its "H" level, an electric potential of a logic power supply potential (e.g., 3V); and (ii) takes the GND electric potential as its "L" level.

Similarly, the hold signal HLD is a binary signal which: (i) takes, as its "H" level, an electric potential of 10V which switches the P-channel MOS transistor to the OFF state; and (ii) takes, as its "L" level, the electric potential (e.g. 7V) which switches the P-channel MOS transistor to the ON state. Further, the inverted hold signal/HLD is a binary signal which: (i) takes, as its "H" level, an electric potential (e.g. 3V) which switches the N-channel MOS transistor to the ON state; and (ii) takes the GND electric potential as its "L" level. Further, the signal A and the signal B are output signals from the logic circuit operated by the logic power supply. The both the signals A and B are binary logic signals which: (i) take, as their "H" levels, the electric potential of the logic power supply (e.g. 3V); and (ii) take the GND electric potential as their "L" levels.

The following describes in detail the operation of the circuit of FIG. 2, with reference to the timing chart of FIG. 3. First, when: (i) the level of the hold signal HLD transits to the "H" level; and (ii) the level of the inverted hold signal/HLD transits to the "L" level; the signal D enters a floating state in which the signal level of the signal D is not driven by anything. During the floating state, the signal, which has been inputted before the transitions, is maintained at the electric potential having been stored in the load capacitor C2. Next, when the precharge signal/PRE transits its signal level to the "L" level, the MOS transistor MP1 is switched to the ON state, and the load capacitor C1 is charged thus raising the electric potential of the signal C up to 10V which is the electric potential of the power supply. Subsequently, when the signal level of the precharge signal/PRE shifts back to the "H", the MOS transistor MP1 is switched to the OFF state, and the signal C enters the floating status in which the signal level of the signal C is not driven by anything, and the electric potential of the signal C is maintained at 10V which is an electric load stored in the load capacitor C1.

Next, the discharge signal/DIS shifts its signal level to the "L" level. At this point, if the signal A is in the "L" level, the signal B is in the "H" level, and therefore the MOS transistor MN1 is switched to the ON state. This causes the load capacitor C1 to discharge the electric load having been stored, thus causing the signal level of the signal C to drop to the "L" level. On the contrary, when the signal A is the "H" level, the signal B is the "L" level. The MOS transistor MN1 therefore is switched to the OFF state, and the electric potential of the signal C is maintained at 10V.

Then, when the signal level of the hold signal HLD transits to the "L" level, and the signal level of the inverted hold signal/HLD transits to the "H" level, an inverted signal of the signal C is outputted as the signal D. First, when the discharge signal/DIS transits its signal level to the "H" level, the signal level of the signal B enters, irrespective of the state of the signal A, a floating state in which the signal level is not driven by anything. At this point, the signal, which has been inputted before the transitions, are maintained at the electric potential having been stored in the load capacitor C1.

As described, the signal C of 10V is sampled while the signal A is in the "H" level, and the signal C of the GND electric potential is sampled while the signal A is in the "L" level. Accordingly, when the signal level of the signal A (i.e., output signal from the 3V logic circuit) transits, there is obtained a binary signal which takes 10V as its "H" level, and which takes the GND electric potential as its "L" level.

In the level shifting circuit of the present embodiment, the signals for controlling the sampling operation (i.e., CTL1, CTL2, /PRE, HLD, and /HLD, as well as the signal B outputted from the circuit which is operated by the logic power supply) are used for either one of the P-channel MOS transistor or the N-channel MOS transistor. In other words, there is no signal which is used in both the P-channel MOS transistor and the N-channel MOS transistor. Accordingly, as in the MOS transistors MP1 and MN1, while the P-channel MOS transistor is in the ON state, the corresponding N-channel MOS transistor is in the OFF state. On the contrary, while the N-channel MOS transistor is in the ON state, the corresponding P-channel MOS transistor is in the OFF state. As described, the level shifting circuit of the present embodiment has no circuit in which a cross-current is generated by simultaneously switching, upon a variation in a control signal, the MOS transistors to the ON state, the MOS transistors being between the first electric potential power supply and the GND.

Since, the P-channel MOS transistor and the N-channel MOS transistor are not switched to the ON state at the same time, it is possible to determine the size of each MOS transistor, irrespective of other MOS transistors. Accordingly, unlike a conventional level shifting circuit, the level shifting circuit of the present embodiment does not require an element having a long gate-length or a wide gate-width. Further, in a case of using an MOS transistor having a large planar dimension for realizing a high-voltage resilience, the level shifting circuit of the present embodiment only requires two elements (i.e., one P-channel MOS transistor and one N-channel MOS transistor) for performing the level shifting operation and the sampling operation. Thus, it is possible to downsize the planar dimension of the level shifting circuit. Further, when the level shifting circuit is formed into an LSI, the size of the chip can be reduced.

As a result, it is possible to realize a level shifting circuit whose circuit scale is small.

Further, in the level shifting circuit of the present embodiment, the control signal used for the P-channel MOS transistor and that used for the N-channel MOS transistor are independent from each other. As such, all the control signals only needs to have the amplitude which is enough for switching ON/OFF the respective MOS transistors. Accordingly, it is not necessary to fully swing the signals within the range of the power source voltage as in the range between the first electric potential and the GND potential, and it is possible to set a second and third electric potentials between the first electric potential and the GND potential. Reduction of the amplitude of the control signals reduces the influence from the feed-through which occurs due to the parasitic capacitance between the gate and the drain of the MOS transistor. Thus, it is possible to realize a stable sampling operation. This is described hereinbelow.

Figure 7:
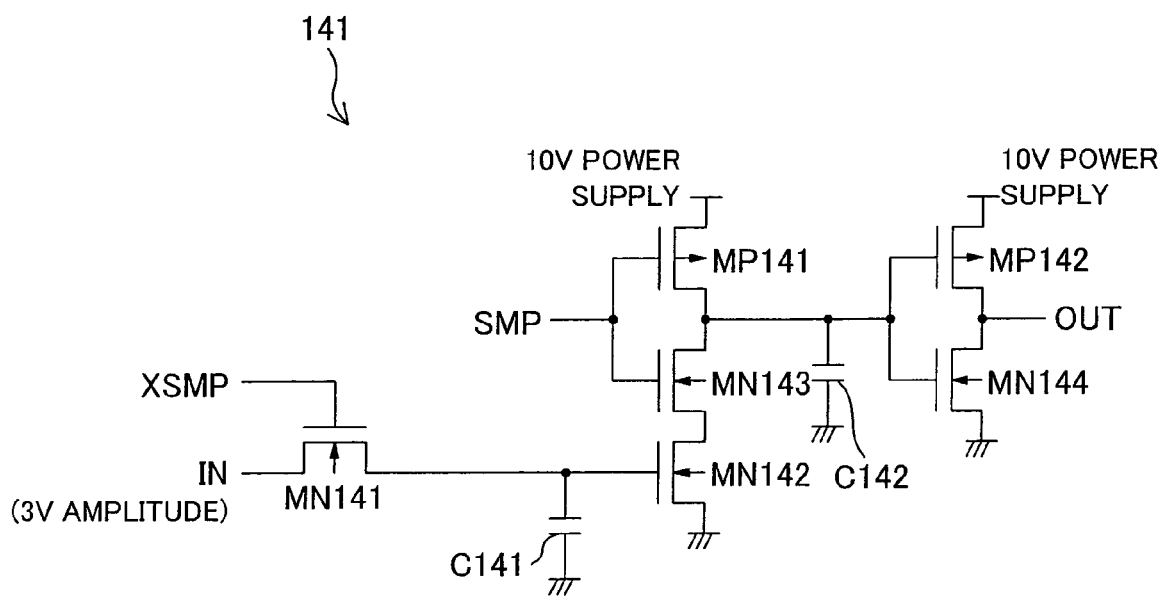
FIG. 7 shows another conventional technology, and is a circuit diagram illustrating a second example of a level shifting circuit to which the dynamic decoding circuit of FIG. 6 is applied.
Figure 9:
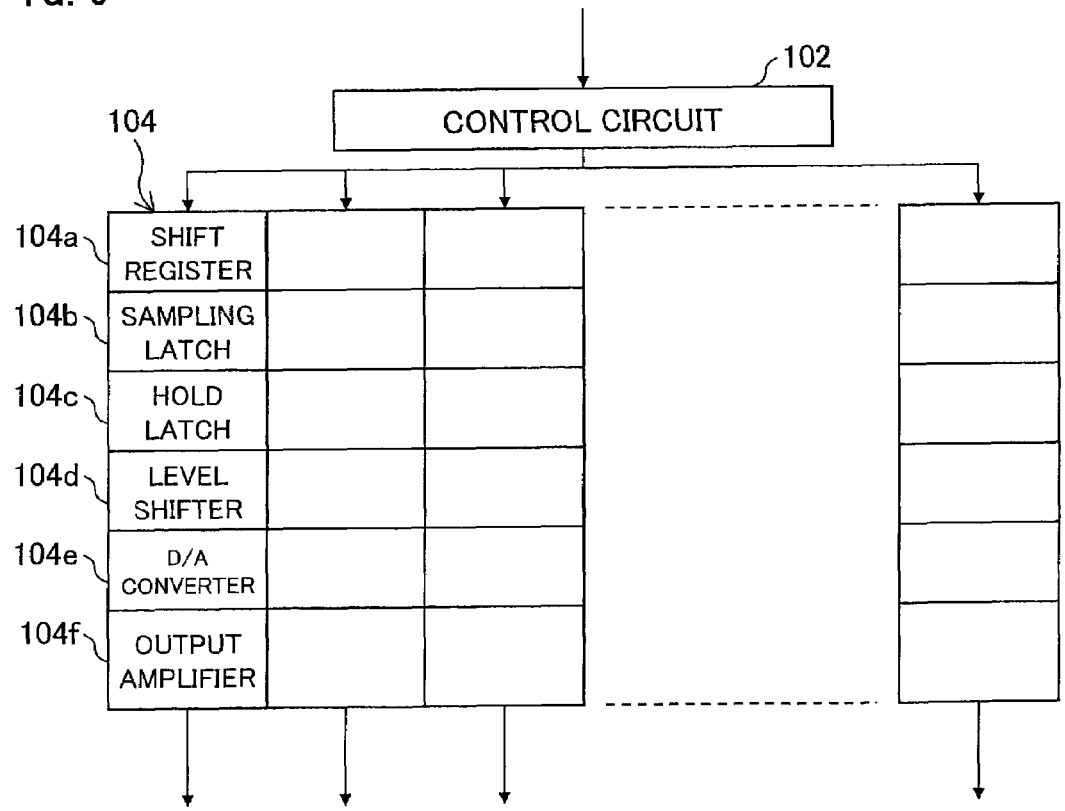
FIG. 9 is a block diagram illustrating a configuration of a source driver circuit to be provided in the TFT-LCD module of FIG. 8.

The circuit of the present embodiment and the circuit of the second conventional example (See FIG. 7) deal with a digital signal, and therefore do not require a sampling accuracy required in a sampling circuit for analogue signals. However, the influence from the feed-through must be considered, for retaining a sampling voltage in a minute-sized load capacitor. A memory circuit, to which the second conventional example is adopted, has long wiring and generates such a parasitic capacitance that the influence from the feed-through can be ignored. This is because a bit line to which a number of memory cells are connected is charged and discharged. However, as it is apparent from FIG. 9 and FIG. 10, an LCD driver at which the present embodiment is targeted requires one sampling circuit for each bit of display data. On this account, if the configuration of the second conventional example is applied, as it is, to the LCD driver circuit, the parasitic capacitance alone is not able to prevent the retained voltage from largely being varied due to the influence from the feed-through. In view of that, it is necessary to add an additional load capacitor for each bit of the display data, which consequently increases the chip size.

As mentioned above, the feed-through is small in the present embodiment, and therefore only requires a small load capacitor for the sampling process. For example, it is possible to realize a sufficiently practical performance with a use of the parasitic capacitance and the capacitance of the gate in the subsequent stage. In this case, no additional capacitance is needed. Therefore, the circuit scale can be further reduced. Particularly in a case of using only the gate capacitance as the load capacitance, no additional capacitance is needed, and the circuit scale can be made extremely small. Note however that, even if an additional load capacitor is added, the circuit scale of the level shifter can be made small. This is because an element having a long and/or wide gate is not needed, and a level shifting operation and a sampling operation can be performed with the use of only two high-voltage resilient MOS transistors, as described above.

Further, the second control signal and the signal B are generated by the NOR circuit 2 to which binary signals (i.e., the data signal, the third signal, and the discharge signal/DIS) are inputted. Therefore, the electric potential of the power supply for the combinational logic circuit is used for the second control signal and the signal B. This allows the second control signal and the signal B to have a small amplitude. Further, each of the data signal DATA, the signal A, the third control signal, and the discharge signal/DIS is a binary signal which takes the third electric potential and the GND electric potential as binary values. Therefore, it is possible to generate these signal in a circuit which is operated by the same electric potential used for operating the combinational logic circuit (i.e., NOR circuit 2).

Figure 4:
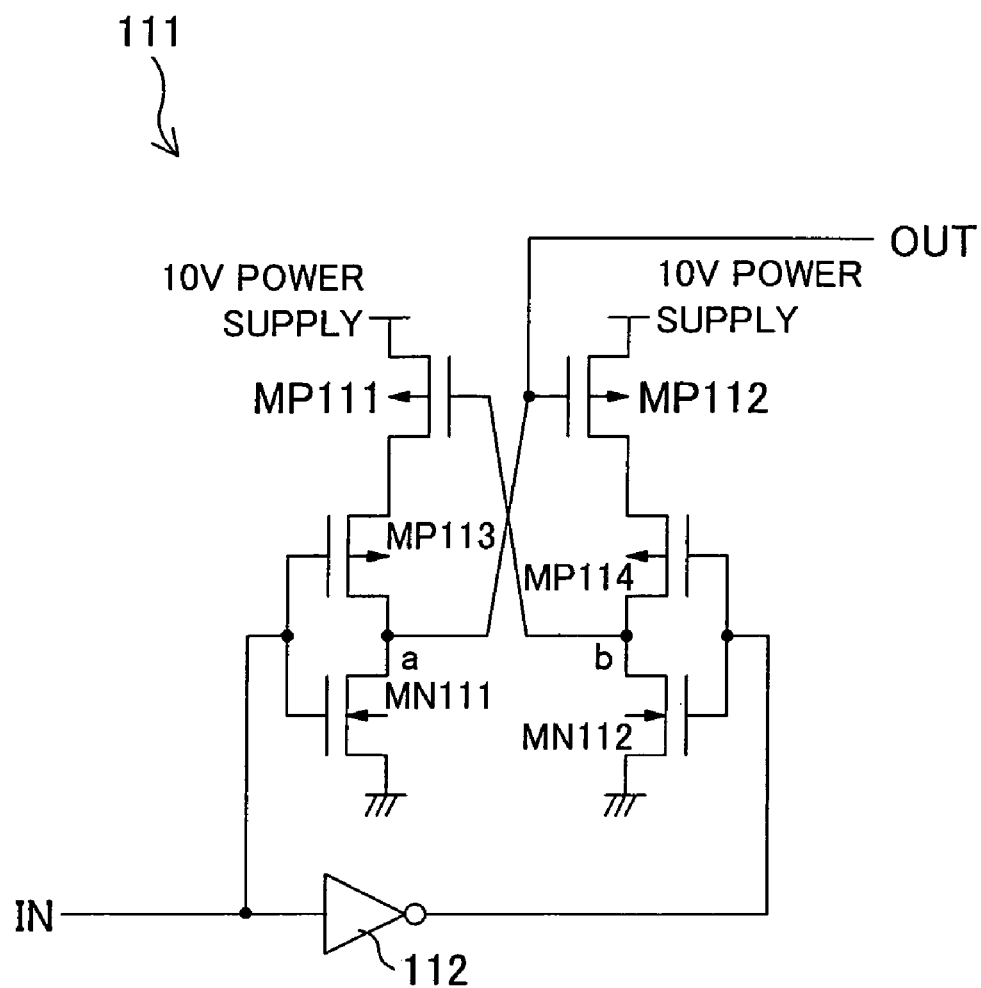
FIG. 4 shows a conventional technology, and is a circuit diagram illustrating a configuration of a first example of a level shifting circuit.
Figure 5:
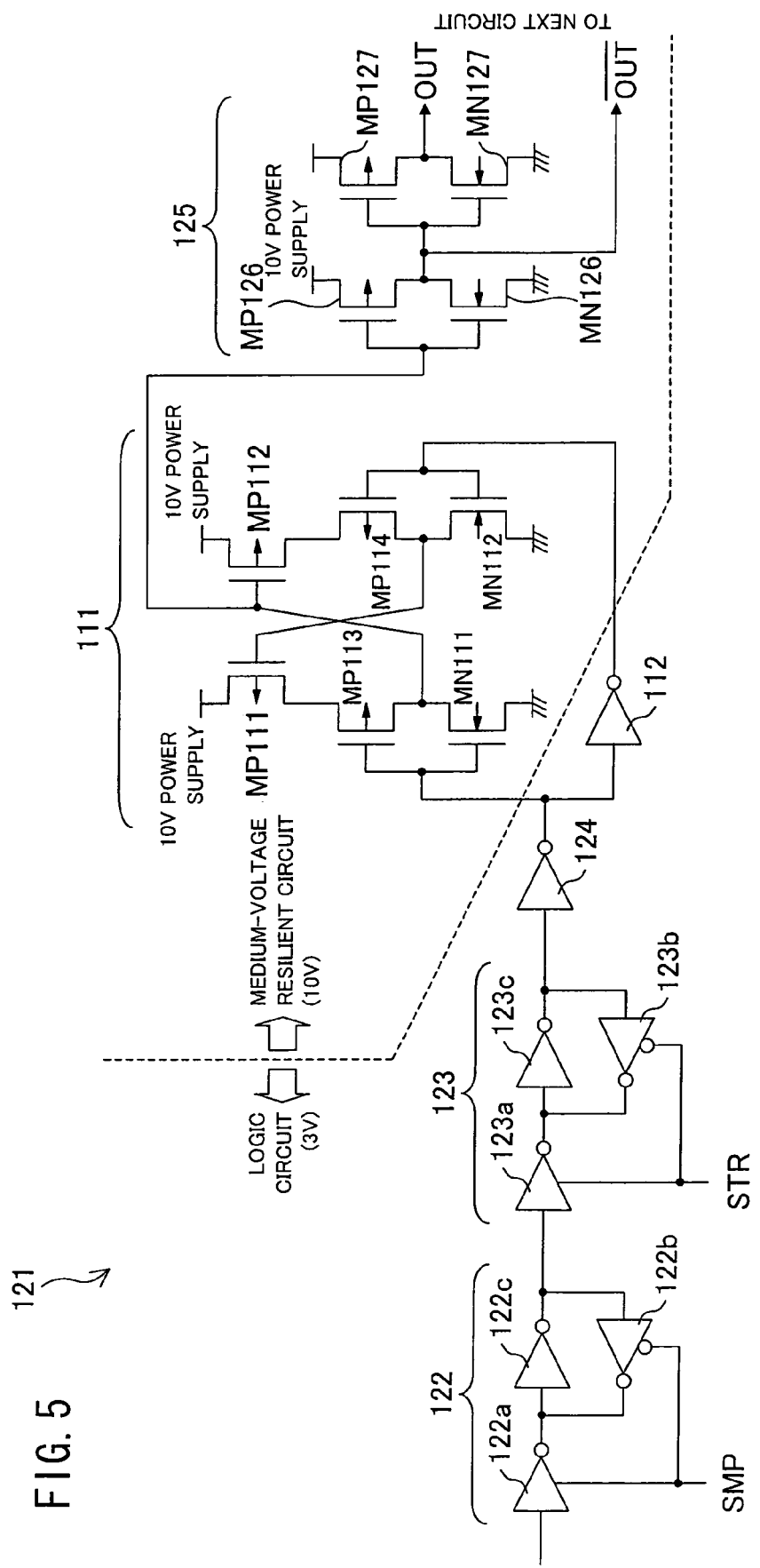
FIG. 5 is a circuit diagram illustrating a part of a configuration of a TFT-LCD source driver circuit to which the level shifting circuit of FIG. 4 is adopted.
Figure 6:
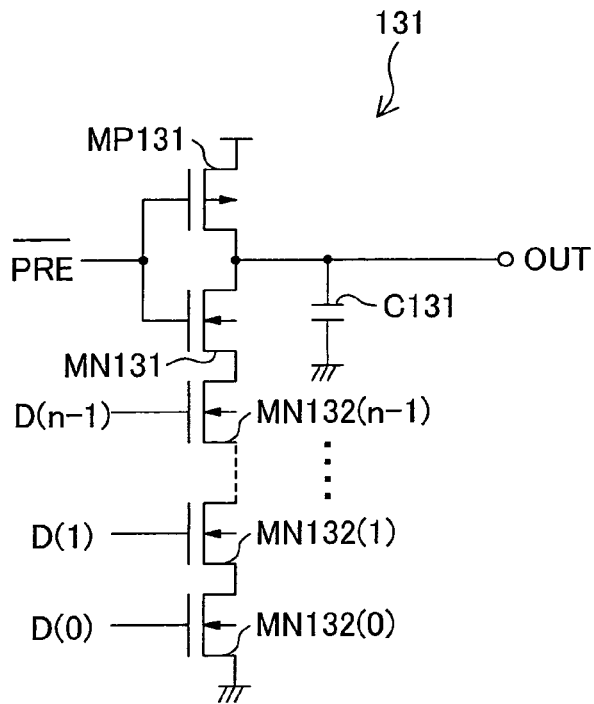
FIG. 6 is a circuit diagram illustrating a configuration of a dynamic decoding circuit.

Further, in the conventional level shifting circuit illustrated in FIG. 4, a large current is temporarily generated between the 10V-power supply and the GND, when the input signal is inverted. For example, in FIG. 4, the MOS transistors MP111, MP113 are still in the ON state, immediately after the MOS transistor MN 111 is switched to the ON state upon the inversion of the input signal. Therefore, between the 10V-power supply and the GND, a large cross current flows through the MOS transistors MP111, MP113, and MN111. This causes an increase in the current consumption in the circuit during its operation. On the contrary, the level shifting circuit of the present embodiment generates no cross current generated in the conventional level shifting circuit. Therefore, it is possible to realize a circuit whose power consumption is low.

By adopting the level shifting circuit to a display element driving circuit of a TFT-LCD or the like, for shifting the level of display data to be supplied to a display element, the circuit scale and the power consumption of the display element driving circuit are reduced.

Figure 8:
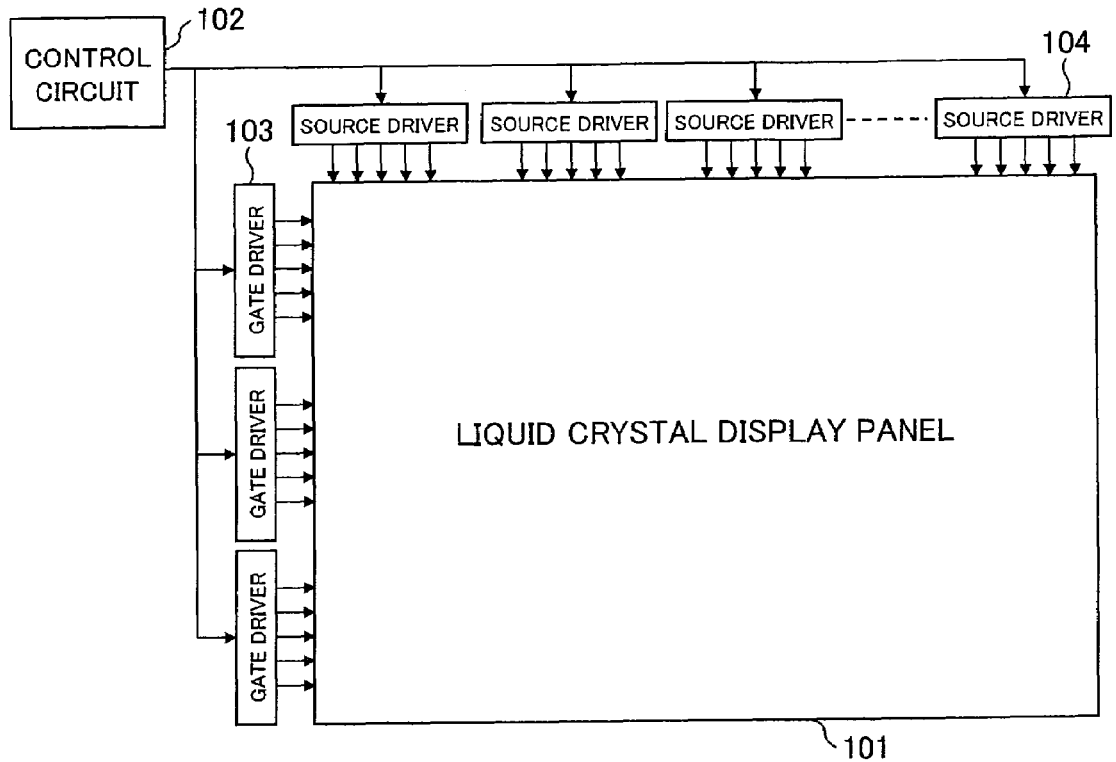
FIG. 8 is a block diagram illustrating a configuration of a TFT-LCD module.

Further, it is possible to realize a small TFT-LCD module whose power consumption is low, by adopting, as the source driver circuit 104 of the TFT-LCD module of FIG. 8, the display element driving circuit having the level shifting circuit. In short, the size and the power consumption of a display panel can be reduced by adopting a display element driving circuit using the level shifting circuit.

The above description deals with the case where the embodiment of the present invention is applied to a TFT-LCD source driver circuit. However, the present invention alone can be used as a level shifting circuit. Therefore, the present invention can be applied, in the same manner, to any logic circuits requiring a level shifting circuit.

The present invention is not limited to the embodiments above, but may be altered within the scope of the claims. That is, an embodiment based on a proper combination of technical means disclosed in different embodiments is encompassed in the technical scope of the present invention.

The present invention is suitably applied to a circuit which drives a display element such as a liquid crystal display element.

In order to achieve the foregoing object, a level shifting circuit of the present invention is adapted so that both the second electric potential and the third electric potential are electric potentials between the first electric potential and the GND potential.

In the invention, the second and the third electric potentials are set within a range between the first electric potential and the GND electric potential. Therefore, the first and the second control signals both have a small amplitude. Accordingly, with the invention, it is possible to reduce the influence from the feed-through which occurs due to the parasitic capacitance between the gate and the drain of the MOS transistor. Thus, a stable sampling operation can be realized.

Further, since the feed-through is small, a small load capacitor is enough for the sampling process. This allows further reduction of the circuit scale.

In order to achieve the foregoing object, the level shifting circuit of the present invention is adapted so that the load capacitor is a parasitic capacitance of the circuit.

In the invention, load capacitor is the parasitic capacitance of the circuit, such as the parasitic capacitance of the wiring or the gate capacitance of the MOS transistor. Accordingly, no additional capacitance is needed, and the circuit scale can be further reduced.

In order to achieve the foregoing object, the level shifting circuit of the present invention is adapted so that the capacitance of the load capacitor is a gate capacitance of an MOS transistor in a subsequent stage to the first MOS transistor and the second MOS transistor.

The invention uses, as a sampling-use capacitance, only the gate capacitance of the MOS transistor in the next stage. Accordingly, long wiring is no longer needed, and the circuit scale can be made extremely small.

In order to achieve the foregoing object, the level shifting circuit of the present invention is adapted so that the second control signal is generated by a combinational logic circuit to which a data signal and a third control signal, each of which is a binary signal, are inputted.

With the invention, the second control signal can be a signal, whose amplitude is small, and which uses the power supply electric potential of the combinational logic circuit.

In order to achieve the foregoing object, the level shifting circuit of the present invention is adapted so that both the data signal and the third control signal takes (i) the third electric potential, and (ii) the GND electric potential as binary values.

With the invention, the data signal and the third control signal can be generated in the circuit sharing the same power supply as the combinational logic circuit.

In order to achieve the foregoing object, a display element driving circuit of the present invention includes the above mentioned level shifting circuit performing a level shifting process with respect to display data to be supplied to a display element.

With the invention, it is possible to realize a display element driving circuit whose circuit scale is small, and whose power consumption is low.

In order to achieve the foregoing object, a display panel of the present invention includes the above mentioned display element driving circuit.

With the invention, it is possible to realize a display panel whose circuit scale is small, and whose power consumption is low.

As described, a level shifting circuit of the present invention is a level shifting circuit including: (A) a first MOS transistor of a P-channel type, whose source is connected to a power supply of a first electric potential which is higher than a GND electric potential; and (B) a second MOS transistor of an N-channel type, whose source is connected to a GND, and whose drain is connected to a drain of the first MOS transistor, the level shifting circuit performing a level shifting process with respect to an input signal, by (a) inputting, to a gate of the second MOS transistor, a gate signal which corresponds to the input signal to be subjected to the level shifting process, and (b) charging a load capacitor up to the first electric potential, or discharging the load capacitor down to the GND level, the load capacitor being connected to a connection point of respective drains of the first and the second MOS transistors, wherein: the first MOS transistor receives the first control signal inputted to the gate thereof as a gate signal, the first control signal being a binary signal which takes, as binary values, (i) the first electric potential and (ii) a second electric potential which is lower than the first electric potential; the first MOS transistor charges the load capacitor up to the first electric potential, when the first MOS transistor receives the first control signal of the second electric potential; the second MOS transistor receives a second control signal inputted to a gate thereof as a gate signal, the second control signal being a binary signal which takes, as binary values, (i) the GND electric potential and (ii) a third electric potential which is higher than the GND electric potential, the second control signal being independent from the first control signal; and the second MOS transistor discharges the load capacitor down to the GND electric potential when the second MOS transistor receives the second control signal of the third electric potential.

Thus, it is possible to realize a level shifting circuit whose circuit scale is small.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided that such variations do not exceed the scope of the patent claims set forth below.

What is claimed is:

1. A level shifting circuit including: (A) a first MOS transistor of a P-channel type, whose source is connected to a power supply of a first electric potential which is higher than a GND electric potential; and (B) a second MOS transistor of an N-channel type, whose source is connected to a GND, and whose drain is connected to a drain of the first MOS transistor, the level shifting circuit performing a level shifting process with respect to an input signal, by (a) inputting, to a gate of the second MOS transistor, a gate signal which corresponds to the input signal to be subjected to the level shifting process, and (b) charging a first load capacitor up to the first electric potential, or discharging the first load capacitor down to the GND level, the first load capacitor being connected to a connection point of respective drains of the first and the second MOS transistors, wherein:

the first MOS transistor receives the first control signal inputted to the gate thereof as a gate signal, the first control signal being a binary signal which takes, as binary values, (i) the first electric potential and (ii) a second electric potential which is lower than the first electric potential;

the first MOS transistor charges the first load capacitor up to the first electric potential, when the first MOS transistor receives the first control signal of the second electric potential;

the second MOS transistor receives a second control signal inputted to a gate thereof as a gate signal, the second control signal being a binary signal which takes, as binary values, (i) the GND electric potential and (ii) a third electric potential which is higher than the GND electric potential, the second control signal being independent from the first control signal; and the second MOS transistor discharges the first load capacitor down to the GND electric potential when the second MOS transistor receives the second control signal of the third electric potential; and both the second electric potential and the third electric potential are electric potentials between the first electric potential and the GND potential.

2. The level shifting circuit as set forth in claim 1, wherein the first load capacitor is a parasitic capacitance of the circuit.

3. The level shifting circuit as set forth in claim 2, wherein the capacitance of the first load capacitor is a gate capacitance of an MOS transistor in a subsequent stage to the first MOS transistor and the second MOS transistor.

4. The level shifting circuit as set forth in claim 1, wherein the second control signal is generated by a combinational logic circuit to which a data signal and a third control signal, each of which is a binary signal, are inputted.

5. The level shifting circuit as set forth in claim 4, wherein: both the data signal and the third control signal takes (i) the third electric potential, and (ii) the GND electric potential as binary values.

6. A display element driving circuit, comprising the level shifting circuit set forth in claim 1, the level shifting circuit performing a level shifting process with respect to display data to be supplied to a display element.

7. A display panel, comprising the display element driving circuit set forth in claim 6.

8. A level shifting circuit including: (A) a first MOS transistor of a P-channel type, whose source is connected to a power supply of a first electric potential which is higher than a GND electric potential; and (B) a second MOS transistor of an N-channel type, whose source is connected to a GND, and whose drain is connected to a drain of the first MOS transistor, the level shifting circuit performing a level shifting process with respect to an input signal, by (a) inputting, to a gate of the second MOS transistor, a gate signal which corresponds to the input signal to be subjected to the level shifting process, and (b) charging a first load capacitor up to the first electric potential, or discharging the first load capacitor down to the GND level, the first load capacitor being connected to a connection point of respective drains of the first and the second MOS transistors, wherein:

the first MOS transistor receives the first control signal inputted to the gate thereof as a gate signal, the first control signal being a binary signal which takes, as binary values, (i) the first electric potential and (ii) a second electric potential which is lower than the first electric potential;

the first MOS transistor charges the first load capacitor up to the first electric potential, when the first MOS transistor receives the first control signal of the second electric potential;

the second MOS transistor receives a second control signal inputted to a gate thereof as a gate signal, the second control signal being a binary signal which takes, as binary values, (i) the GND electric potential and (ii) a third electric potential which is higher than the GND electric potential, the second control signal being independent from the first control signal; and the second MOS transistor discharges the first load capacitor down to the GND electric potential when the second MOS transistor receives the second control signal of the third electric potential; and the level shifting circuit further comprising: P-channel third, fourth and seventh MOS transistors; and N-channel fifth, sixth, and eighth MOS transistors, wherein, a source of the third MOS transistor is connected to the first electric potential, and a drain of the third MOS transistor is connected to a source of the fourth MOS transistor, a drain of the fourth MOS transistor is connected to a drain of the fifth MOS transistor, and a source of the fifth MOS transistor is connected to a drain of the sixth MOS transistor, a source of the sixth MOS transistor is connected to the GND, a gate of the third MOS transistor and a gate of the sixth MOS transistor are connected to the connection point of the respective drains of the first and second MOS transistors, a gate of the fourth MOS transistor receives a fourth control signal as a gate signal, and a gate of the fifth MOS transistor receives a fifth control signal as a gate signal, a connection point of respective drains of the fourth and fifth MOS transistors is connected to a second load capacitor, a gate of the seventh MOS transistor, and a gate of the eighth MOS transistor, a source of the seventh MOS transistor is connected to the first electric potential, and a drain of the seventh MOS transistor is connected to a dram of the eighth MOS transistor, a source of the eighth MOS transistor is connected to the GND, a connection point of respective drains of the seventh and eighth MOS transistors is connected to an output terminal, the fourth control signal is a binary signal which takes, as binary values, the first electric potential or a fourth electric potential which is lower than the first electric potential, and the fourth MOS transistor charges the second load capacitor up to the first electric potential when the fourth MOS transistor receives the fourth electric potential as the fourth control signal, and the fifth control signal is a binary signal which takes, as binary values, the GND or a fifth electric potential higher than the GND, and the fifth MOS transistor discharges the second load capacitor down to the GND when the fifth MOS transistor receives the fifth electric potential as the fifth control signal.

9. The level shifting circuit as set forth in claim 8, wherein both the second electric potential and the third electric potential are electric potentials between the first electric potential and the GND potential.

10. The level shifting circuit as set forth in claim 8, wherein both the fourth electric potential and the fifth electric potential are electric potentials between the first electric potential and the GND potential.

11. The level shifting circuit as set forth in claim 10, wherein the second load capacitor is a parasitic capacitance of the circuit.

12. The level shifting circuit as set forth in claim 11, wherein the capacitance of the second load capacitor is a gate capacitance of the seventh MOS transistor and the eighth MOS transistor.

* * * * *